(12) United States Patent
Du et al.

(10) Patent No.: US 11,301,077 B2
(45) Date of Patent: Apr. 12, 2022

(54) PIEZOELECTRIC SENSING APPARATUS AND APPLICATIONS THEREOF

(71) Applicant: Beijing Taifang Technology Co., Ltd, Beijing (CN)

(72) Inventors: Chaoliang Du, Beijing (CN); Hongfeng Guo, Beijing (CN); Qingyu Zhao, Beijing (CN)

(73) Assignee: Beijing Taifang Technology Co., Ltd, Beijing (CN)

( * ) Notice: Subject to any disclaimer, the term of this patent is extended or adjusted under 35 U.S.C. 154(b) by 306 days.

(21) Appl. No.: 16/413,657

(22) Filed: May 16, 2019

(65) Prior Publication Data

US 2019/0267995 A1    Aug. 29, 2019

Related U.S. Application Data

(63) Continuation of application No. PCT/CN2017/110800, filed on Nov. 14, 2017.

(30) Foreign Application Priority Data

Nov. 17, 2016    (CN) .......................... 201611011803.2

(51) Int. Cl.
*H01L 41/47*     (2013.01)
*H01L 41/113*    (2006.01)
(Continued)

(52) U.S. Cl.
CPC .......... *G06F 3/0414* (2013.01); *H01L 41/047* (2013.01); *H01L 41/1132* (2013.01); *H03K 17/964* (2013.01)

(58) Field of Classification Search
CPC .......................... H01L 41/047; H01L 41/1132
(Continued)

(56) References Cited

U.S. PATENT DOCUMENTS

| 2006/0113879 A1* | 6/2006 | Ren | ........................ H04R 31/00 310/366 |
| 2010/0148627 A1* | 6/2010 | Funasaka | ............... G10K 9/122 310/316.01 |
| 2011/0043077 A1* | 2/2011 | Yeh | ......................... G06F 3/016 310/338 |

FOREIGN PATENT DOCUMENTS

| CN | 101192644 A | 6/2008 |
| CN | 101364632 A | 2/2009 |

(Continued)

OTHER PUBLICATIONS

International Search Report of PCT Patent Application No. PCT/CN2017/110800 dated Jan. 30, 2018.

*Primary Examiner* — Derek J Rosenau

(57) ABSTRACT

Disclosed is a piezoelectric sensing apparatus, comprising: a plurality of piezoelectric regions, each piezoelectric region including an anode surface and a cathode surface, wherein the plurality of piezoelectric regions are successively connected from the first piezoelectric region to the last piezoelectric region such that between adjacent piezoelectric regions, surfaces of a same polarity are connected, i.e., one anode surface is connected to another anode surface, while one cathode surface is connected to another cathode surface. The piezoelectric sensing apparatus as provided may effectively boost a high-frequency signal while weaken a low-frequency signal, such that an output waveform signal facilitates improving the positioning accuracy.

9 Claims, 9 Drawing Sheets

(51) Int. Cl.
   *G06F 3/041* (2006.01)
   *H01L 41/047* (2006.01)
   *H03K 17/96* (2006.01)

(58) Field of Classification Search
   USPC ........................................ 310/338, 365, 366
   See application file for complete search history.

(56) References Cited

FOREIGN PATENT DOCUMENTS

| CN | 1898815 B | 10/2010 |
|----|-----------|---------|
| CN | 203216645 U | 9/2013 |
| JP | H11298056 A | 10/1999 |
| JP | 2001068752 A | 3/2001 |
| JP | 2001189501 A | 7/2001 |

\* cited by examiner

PIEZOELECTRIC SENSING APPARATUS AND APPLICATIONS THEREOF

CROSS-REFERENCE TO RELATED APPLICATION

This application is a Continuation Application of PCT Application No. PCT/CN2017/110800 filed on Nov. 14, 2017, which claims priority to Chinese Patent Application No. 201611011803.2 filed on Nov. 17, 2016, the disclosures of which are incorporated in their entirety by reference herein.

FIELD

Embodiments of the present disclosure relate to an apparatus for converting between mechanical energy and electrical energy using piezoelectric effect, and more particularly relate to a piezoelectric sensing apparatus.

BACKGROUND

A piezoelectric sensor is a common sensor for measuring vibration or force, which uses piezoelectric effect of a certain dielectric medium. When an external force is applied to a surface of the dielectric medium, an electric charge is generated on a surface of the dielectric medium to thereby implement measurement of a non-electrical quantity; this is known as direct piezoelectric effect. Inverse piezoelectric effect refers to a phenomenon of mechanical strain when an alternating electric field is applied to the dielectric medium, which is also referred to as electrostriction. A transmitter manufactured with the inverse piezoelectric effect may find applications in electroacoustic and ultrasonic engineering.

Piezoelectric sensors have a wide array of applications in fields such as engineering mechanics, biomedicine, oil exploration, sonic logging, and electroacoustics.

The piezoelectric sensor is generally designed into a sensor module in practical applications so as to facilitate mounting and acquiring signals in fidelity. Designing a piezoelectric sensor module usually takes into account a lead, a preprocessing circuit, a mounting manner, and a manner of connecting a plurality of piezoelectric sensors.

In designing a piezoelectric sensor, signals emitted by a single sensor sometimes cannot amount to a strength for practical application or signals outputted thereby do not facilitate acquisition and recognition. When a plurality of piezoelectric sensor are applied in combination, thanks to their different phases, peaks and troughs of acquired signals will undergo a certain degree of neutralization or superimposition to thereby produce signals of different properties. A conventional combination approach is to connect the sensors in series, where a positive electrode of one sensor is connected to a negative electrode of another sensor, as provided in the patent No. CN200480038012.8, which may effectively boost low-frequency signals while weakening high-frequency signals. For an application of positioning with a mechanical wave (or elastic wave), a high-frequency signal may provide a higher positioning precision due to its higher resolution. However, the combination method provided in the patent CN200480038012.8 weakens the high-frequency signal, which does not facilitate accurate positioning. The present disclosure provides a combination solution which may effectively boost the high-frequency signal while weaken the low-frequency signal, such that an outputted waveform signal facilitates improving the positioning accuracy. Effects of the present disclosure have been proved through experiments.

SUMMARY

Embodiments of the present disclosure provide a piezoelectric sensing apparatus which may effectively boost a high-frequency signal while weakening a low-frequency signal. A specific solution is provided below:

A piezoelectric sensing apparatus, comprising: a plurality of piezoelectric regions, each piezoelectric region including an anode surface and a cathode surface, wherein the plurality of piezoelectric regions are successively connected from the first piezoelectric region to the last piezoelectric region such that between adjacent piezoelectric regions, surfaces of a same polarity are connected, i.e., one anode surface is connected to another anode surface, while one cathode surface is connected to another cathode surface. The piezoelectric region refers to an individual unit with piezoelectric effect, e.g., a piezoelectric ceramic, a piezoelectric crystal, or a piezoelectric thin film, etc.

Further, the piezoelectric sensing apparatus further comprises a first lead electrode and a second lead electrode, which are respectively coupled to a non-connection end of the first piezoelectric region with its adjacent piezoelectric region and a non-connection end of the last piezoelectric region with its adjacent piezoelectric region. If the anode surface of the first piezoelectric region is electrically connected to the anode surface of its adjacent piezoelectric region, the first lead electrode is coupled to the cathode surface of the first piezoelectric region; if the cathode surface of the first piezoelectric region is electrically connected to the cathode surface of its adjacent piezoelectric region, the first lead electrode is coupled to the anode surface of the first piezoelectric region; if the anode surface of the last piezoelectric region is electrically connected to the anode surface of its adjacent piezoelectric region, the second lead electrode is coupled to the cathode surface of the last piezoelectric region; and if the cathode surface of the last piezoelectric region is electrically connected to the cathode surface of its adjacent piezoelectric region, the second lead electrode is coupled to the anode surface of the last piezoelectric region.

Further, besides the first lead electrode and the second lead electrode, the piezoelectric sensing apparatus further comprises a connecting electrode, the connecting electrode being adapted to connecting a plurality of separate piezoelectric regions, the connecting electrode being rigid or flexible, wherein the rigid connecting electrode is for example a printed electrode, while the flexible electrode is for example adapted to connecting the plurality of separate piezoelectric regions via a flexible electrical conductor.

Further, the plurality of piezoelectric regions are provided in a single piezoelectric structure.

Optionally, the plurality of piezoelectric regions are provided in different piezoelectric structures.

Further, the plurality of piezoelectric regions are arranged abreast.

Optionally, the plurality of piezoelectric regions are arranged in a straight-line link.

Optionally, the plurality of piezoelectric regions are arranged in a two-dimensional array form.

Optionally, the plurality of piezoelectric regions are arranged in layers or in a three-dimensional array form.

Further, a padded insulative material is arranged between the plurality of piezoelectric regions.

Further, distance adjustability is provided between the plurality of piezoelectric regions.

Further, piezoelectric bodies in the plurality of piezoelectric regions are not limited to a square shape, which may have a circular shape or other shapes.

The present disclosure provides a combination solution which may effectively boost a high-frequency signal while weaken a low-frequency signal, such that an outputted waveform signal facilitates improving the positioning accuracy.

REFERENCE NUMERALS

Figure 1:
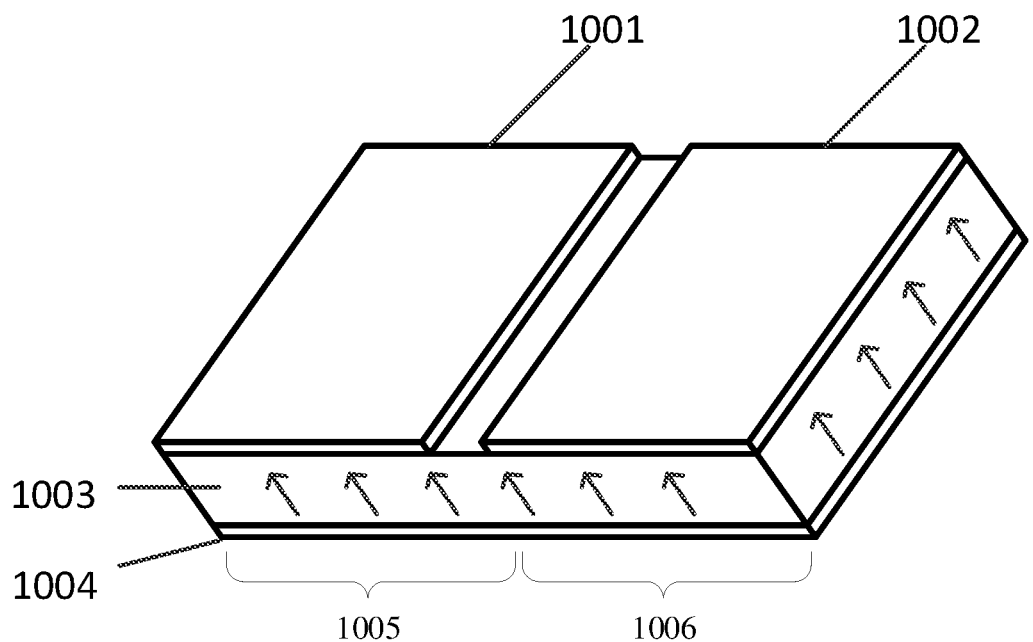
FIG. 1 shows a schematic diagram of a first structure of Embodiment 1 of the present disclosure.

1001—first lead electrode; 1002—second lead electrode; 1003—piezoelectric material;
1004—electrode; 1005—first piezoelectric region; 1006—second piezoelectric region;
2001—first lead electrode; 2002—second lead electrode; 2003—piezoelectric material;
2004—electrode; 2005—first piezoelectric region; 2006—second piezoelectric region;
3001—electrode; 3002—electrode; 3003—piezoelectric material; 3004—first lead electrode;
3005—second lead electrode; 3006—connecting wire; 3007—first piezoelectric region; 3008—second piezoelectric region;
4001—first lead electrode; 4002—electrode; 4003—second lead electrode;
4004—electrode; 4005—piezoelectric material; 4006—electrode;
4007—first piezoelectric region; 4008—second piezoelectric region; 4009—third piezoelectric region; 4010—fourth piezoelectric region;
5001—electrode; 5002—electrode; 5003—first piezoelectric region; 5004—first lead electrode;
5005—second lead electrode; 5006—second piezoelectric region; 5007—connecting wire; 6001—first lead electrode;
6002—second lead electrode; 6003—first piezoelectric region; 6004—electrode; 6005—second piezoelectric region; 6006—insulative connecting sheet;
7001—first lead electrode; 7002—electrode; 7003—first piezoelectric region; 7004—electrode;
7005—second piezoelectric region; 7006—third piezoelectric region; 7007—second lead electrode;
8001—first lead electrode; 8002—electrode; 8003—second lead electrode; 8004—first piezoelectric region;
8005—electrode; 8006—second piezoelectric region; 8007—third piezoelectric region; 8008—electrode; 8009—fourth piezoelectric region;
9001—first lead electrode; 9002—electrode; 9003—electrode; 9004—electrode; 9005—second lead electrode;
9006—first piezoelectric region; 9007—second piezoelectric region; 9008—third piezoelectric region; 9009—fourth piezoelectric region;
10001—first lead electrode; 10002—electrode; 10003—electrode; 10004—electrode; 10005—electrode;
10006—electrode; 10007—electrode; 10008—electrode; 10009—second lead electrode;
10010—first piezoelectric region; 10011—second piezoelectric region; 10012—third piezoelectric region; 10013—fourth piezoelectric region;
10014—fifth piezoelectric region; 10015—sixth piezoelectric region; 10016—seventh piezoelectric region; 10017—eighth piezoelectric region;
11001—first lead electrode; 11002—second lead electrode; 11003—piezoelectric material; 11004—connecting electrode.

DETAILED DESCRIPTION OF EMBODIMENTS

Hereinafter, the technical solution of the present disclosure will be illustrated in detail with reference to the accompanying drawings and the embodiments. It should be understood that the parts illustrated in the drawings are illustrative, not limitative, i.e., the respective features are not drawn in scale.

The principle of the present disclosure will be illustrated with an example of a combination of two sensing apparatuses of the same performance.

The present disclosure may boost a high-frequency signal and weaken a low-frequency signal. The high frequency and the low frequency are termed based on a specific use condition. Because $f$(frequency)=$v$ (wave velocity)/$\lambda$ (wave length), a demarcation point between the high frequency and the low frequency herein is defined as:

$$f=v/(6*d) \tag{1}$$

where $v$ denotes the speed of mechanical wave propagation in a to-be-measured object, and $d$ denotes an equivalent distance between the two piezoelectric regions shown in the figure, generally referring to a distance between centers of the two piezoelectric regions. It needs to be noted that for a wave in a thin sheet structure, $v$ in the equation is not a fixed value, but a function of $f$. A signal with a frequency above the $f=v/(6*d)$ in the equation is referred to as a high-frequency signal, while a signal below the $f=v/6*d)$ ) is referred to as a low-frequency signal. It may be seen from equation (1) that definitions of the high frequency and the low frequency differ with different materials and positions of the two piezoelectric regions. Therefore, the high frequency and the low frequency here are termed relative to the materials and positions of the piezoelectric regions. In the present disclosure, given the materials and the positions of the piezoelectric regions, a beneficial effect of boosting the high-frequency signal while weakening the low-frequency signal may be achieved.

A principle of the present disclosure is provided below:
Supposing that the wave signal in the structure is $$S_0 = A_0 * \sin(a*t + \theta_0) \quad (2);$$

the wave signal outputted by the first sensing apparatus is $$S_1 = A_1 * \sin(a*t + \theta_1) \quad (3);$$

the wave signal outputted by the second sensing apparatus is $$S_2 = A_1 * \sin(a*t + \theta_2) \quad (4);$$

then, the wave signal outputted by the combination in the present disclosure is:

$$S = S_1 - S_2 = A_1 * \sqrt{2 - 2\cos(\theta_1 - \theta_2)} * \sin(a*t + \theta_3) \quad (5)$$

In the equation above, $A_1 * \sqrt{2 - 2*\cos(\theta_1 - \theta_2)}$ refers to an amplitude of the output wave signal S. For a 0-order anti-symmetrical wave in the thin sheet structure, when the frequency θ increases, the wavelength λ will decrease. As the equivalent distance d between the two sensors maintains unchanged and the phase difference is $|\theta_1 - \theta_2| = 2*\pi*d/\lambda$, when when $|\theta_1 - \theta_2| < \pi$, namely, $d/\lambda < \frac{1}{2}$, f increases, and the amplitude of S increases. Therefore, the combination according to the present disclosure may effectuate amplification of the high-frequency signal to up to twice of the original signal, while weakening the low frequency approximately to 0. Meanwhile, it may be seen that by adjusting the magnitude of d, the amplification multiple of the signal may be adjusted.

However, in the prior art, the signal outputted by the combination is:

$$S = S_1 + S_2 = A_1 * \sqrt{2+2} * \cos(\theta_1 - \theta_2) * \sin(a*t + \theta_4) \quad (6)$$

wherein when f increases, the amplitude of S decreases, just opposite to the present disclosure.

Figure 12:
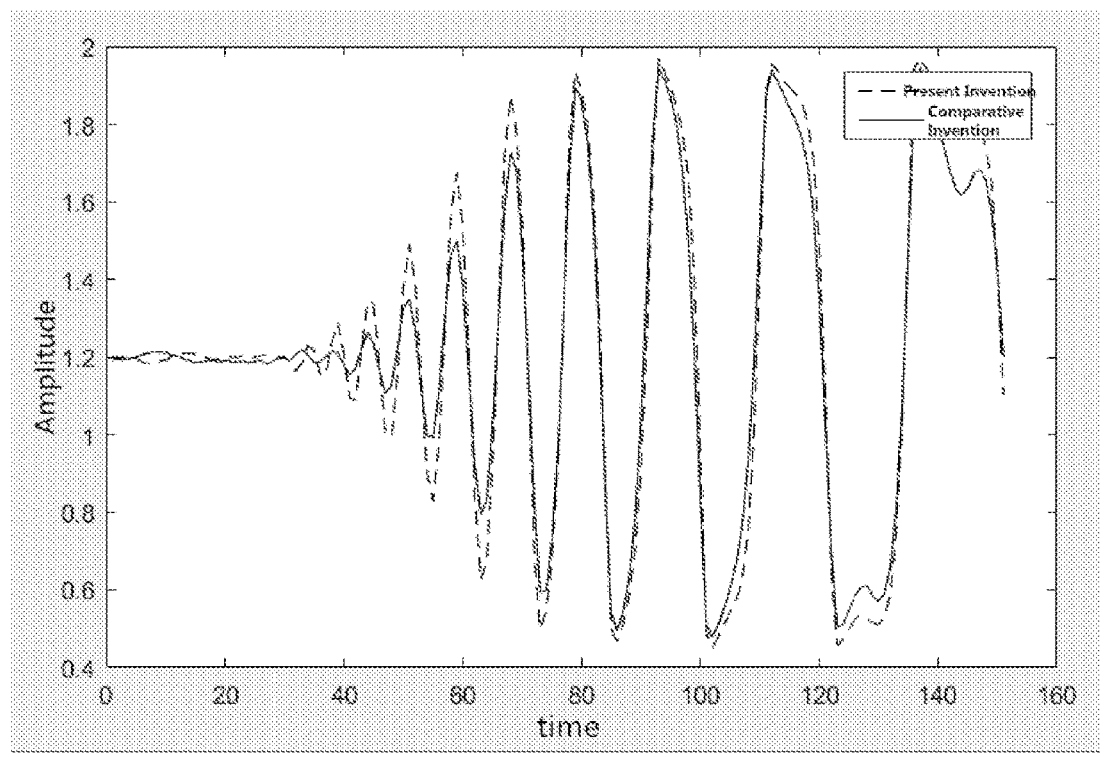
FIG. 12 shows an experimental effect comparison diagram between the present disclosure and the prior art.

FIG. 12 shows an experimental effect comparison diagram between the present disclosure and the prior art. In this embodiment, two pieces of piezoelectric ceramic sensors are connected in series according to the prior art and connected according to the method provided in the present disclosure, respectively; meanwhile, a same vibration form is collected on a glass medium. The experiment shows that at the earliest high-frequency stage, the amplitude of the waveform of the present disclosure is apparently higher than that of the comparative prior art, and after the wave frequency drops, there is no apparent difference between the amplitude of the present disclosure and that of the prior art. This indicates that the connection manner according to the present disclosure may play a role of boosting the high frequency signal. In a specific application, if the to-be-measured frequency is greater than the boundary frequency of the present disclosure, application of the method according to the present disclosure may effectively boost the high-frequency signal.

Embodiment 1

FIG. 1 shows a first structural schematic diagram of Embodiment 1. The structure comprises a first lead electrode 1001, a second lead electrode 1002, a first piezoelectric region 1005, a second piezoelectric region 1006, and an electrode 1004. Particularly, the first piezoelectric region 1005 and the second piezoelectric region 1006 are both located in the piezoelectric material 1003, wherein the piezoelectric material 1003 is a material with piezoelectric effect. Piezoelectric materials may be classified into inorganic piezoelectric materials and organic piezoelectric materials. The inorganic piezoelectric materials are further divided into piezoelectric crystals (such as crystal (quartz crystal), lithium gallate, lithium germanate, titanium germanate, and ferrite-transistor lithium niobate, lithium tantalate, etc.) and piezoelectric ceramics (such as barium titanate BT, lead zirconate titanate PZT, modified lead zirconate titanate, lead metaniobate, barium lithium lead niobite PBLN, modified lead titanate PT, etc.). The organic piezoelectric materials are also referred to as piezoelectric polymers, such as poly(vinylidene fluoride) (PVDF)(thin film), and other organic piezoelectric (thin film) materials represented by PVDF. In this embodiment, a piezoelectric ceramic is adopted. In this embodiment, the first piezoelectric region 1005 and the second piezoelectric region 1006 are both located in the piezoelectric material 1003, i.e., the two piezoelectric regions are located in the same piezoelectric structure. Of the two piezoelectric regions, the upper surfaces are cathode surfaces, while the lower surfaces are anode surfaces. The electrode 1004 is coupled on the anode surfaces to thereby implement electrical connection of the two piezoelectric regions; electrodes are coupled to cathode surfaces of the two piezoelectric regions, respectively, to form a first lead electrode 1001 and a second lead electrode 1002, for electrically connecting the piezoelectric sensing apparatus to an external circuit. In the present disclosure, the electrodes are metal coating films. When the piezoelectric sensing apparatus is working, electric charges with the same number but opposite polarities are accumulated on the two surfaces of a piezoelectric region due to the piezoelectric effect, wherein the surface where positive electric charges are accumulated is referred to as the anode surface, while the surface where negative electric charges are accumulated is referred to as the cathode surface; the electrode coupled to the anode surface are referred to as a positive electrode, while the electrode coupled to the cathode surface is referred to as a negative electrode. The electrode adopts a material with a good conductivity, for example, a metal material such as aluminum, gold, silver, etc., or adopts a layered electrode having a three-layered structure including Ag—Ni—Sn, Ag—Ni—Au, or Cu—Ni—Sn (BME), which guarantees that when a relatively small potential difference is generated, electrode impedance does not cause significant diminishment of the output current. In FIG. 1, the electrode 1004 is a positive electrode, while the first lead electrode 1001 and the second lead electrode 1002 are negative electrodes; polarization directions of the first piezoelectric region 1005 and the second piezoelectric region 1006 are both from the anode surface to the cathode surface; the electrode 1004 electrically connects the anode surface of the first piezoelectric region and the anode surface of the second piezoelectric region; the first lead electrode 1001 and the second electrode lead 1002 are respectively connected to a lead wire or connected to an external circuit via electrically conductive tracks. a material appropriate for electrical connection, such as a welding material, a conductive paste, or a conductive glue, etc., may be used to connect the lead electrodes to the external circuit.

When in use, the electrode 1004 is mechanically connected to a to-be-measured vibrating object, e.g., by welding or gluing with an adhesive. Upon mechanical connection, it is allowed to only connect several points or lines on the electrode to the vibrating object. In this embodiment, to increase a contact area between the piezoelectric sensing apparatus and the to-be-measured vibrating object so as to increase the accuracy of detection, the entire electrode surface is adhered to the to-be-measured vibrating object via an adhesive. When a vibration occurs, the electrode 1004 is stressed on the surface, and the pressure will be transmitted to the piezoelectric material 1003. Thanks to the piezoelectric effect, a potential difference will be produced between the two negative electrodes (i.e., the lead electrode 1001 and the lead electrode 1002). Under the action of the potential difference, a small current output is produced on the lead wire or the electrically conductive track. This small current is just the to-be-measured electrical signal.

Figure 2:
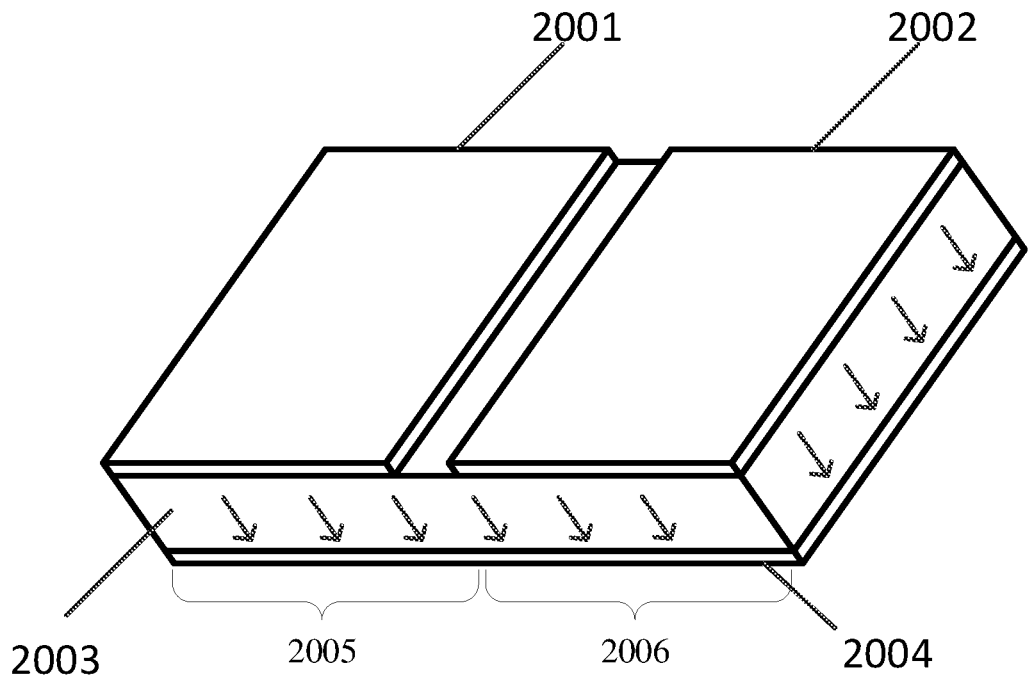
FIG. 2 shows a schematic diagram of a second structure of Embodiment 1 of the present disclosure.

FIG. 2 shows a second structural schematic diagram of Embodiment 1. The structure comprises a first lead electrode 2001, a second lead electrode 2002, a first piezoelectric region 2005, a second piezoelectric region 2006, and an electrode 2004. Particularly, the first piezoelectric region 2005 and the second piezoelectric region 2006 are both located in the piezoelectric material 2003, i.e., the two piezoelectric regions are located in the same piezoelectric structure. Of the two piezoelectric regions, the upper surfaces are cathode surfaces, while the lower surfaces are anode surfaces. Their polarization directions are both from the cathode surfaces to the anode surfaces. Electrodes are coupled on the anode surfaces and the cathode surfaces of the two piezoelectric regions, respectively, wherein the electrode 2004 is a positive electrode, while the first lead electrode 2001 and the second lead electrode 2002 are negative electrodes. The electrode 2004 connects the anode surface of the first piezoelectric region and the anode surface of the second piezoelectric region. The first lead electrode 1001 and the second lead electrode 1002 are adapted to connect the piezoelectric sensing apparatus to an external circuit. Upon use, the first lead electrode 2001 and the second lead electrode 2002 are respectively connected to the lead wire or to the external circuit via a conductive track. The electrode 2004 is mechanically connected to the to-be-measured vibrating object.

Figure 3:
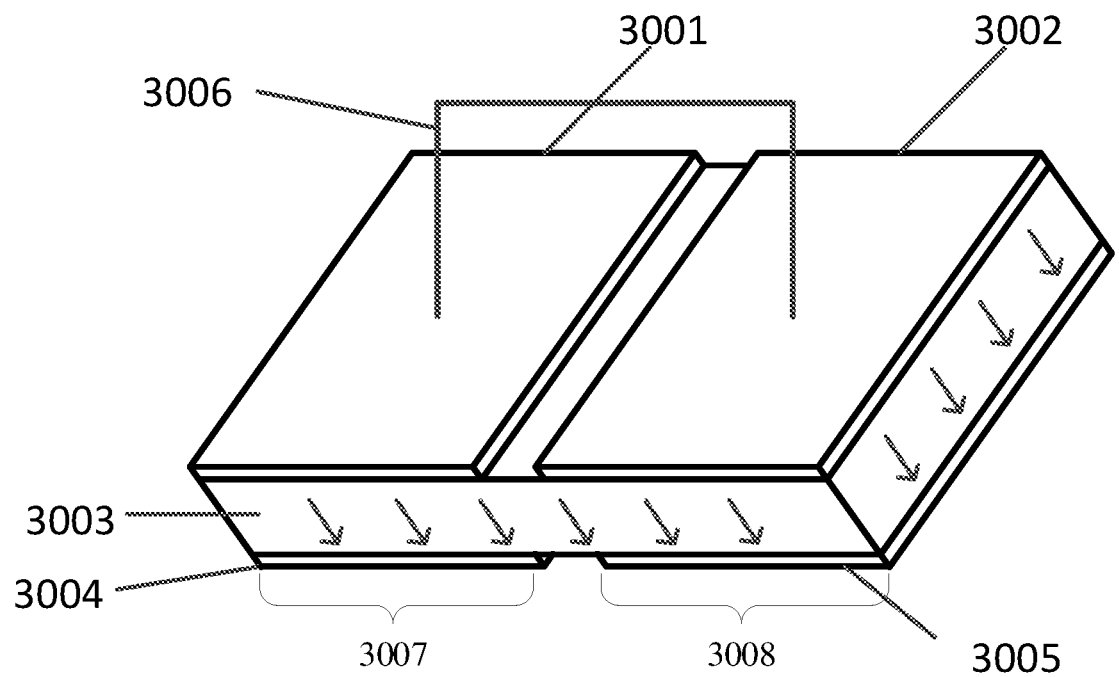
FIG. 3 shows a schematic diagram of a third connection of Embodiment 1 of the present disclosure.

FIG. 3 shows a third structural schematic diagram of Embodiment 1. The structure comprises a first lead electrode 3004, a second lead electrode 3005, a first piezoelectric region 3007, a second piezoelectric region 3008, an electrode 3001, an electrode 3002, and a connecting wire 3006. Particularly, the first piezoelectric region 3007 and the second piezoelectric region 3008 are both located in the piezoelectric material 3003, i.e., the two piezoelectric regions are located in the same piezoelectric structure. Of the two piezoelectric regions, the upper surfaces are anode surfaces, while the lower surfaces are cathode surfaces. Their polarization directions are both from the anode surfaces to the cathode surfaces. Electrodes are coupled on the anode surfaces and the cathode surfaces of the two piezoelectric regions, respectively, wherein the electrode 3001 and the electrode 3002 are positive electrodes, the first lead electrode 3004 and the second lead electrode 3005 are negative electrodes, and the connecting wire 3006 connects the two positive electrodes (i.e., electrode 3001 and electrode 3002) to thereby implement electrical connection between the anode surfaces of the two piezoelectric regions. The first lead electrode 3004 and the second lead electrode 3005 are adapted to electrically connecting the piezoelectric sensing apparatus and the external circuit. Upon use, the first lead electrode 3004 and the second lead electrode 3005 are respectively connected to the lead wire or connected to the external circuit via a conductive track. Upon use, it is allowed to only mechanically connect the electrode 3001 or electrode 3002 to the to-be-measured vibrating object. However, to increase a contact area between the piezoelectric sensing apparatus and the to-be-measured vibrating object so as to improve detection accuracy, in this embodiment, the electrode 3001 and the electrode 3002 are both mechanically connected to the to-be-measured vibrating object. In the following exemplary structures, this connection manner is adopted to increase the contact area between the piezoelectric sensing apparatus and the to-be-measured vibrating object.

Figure 4:
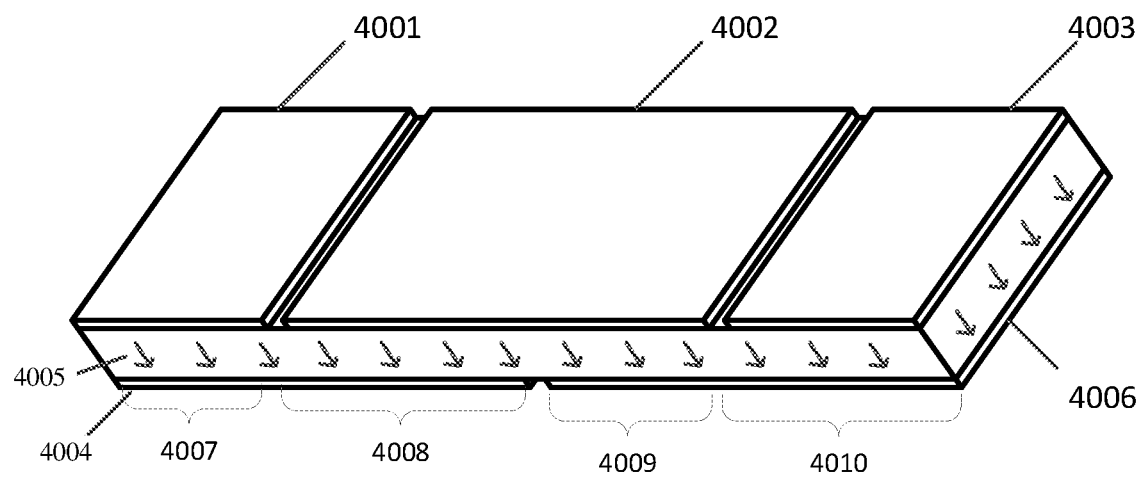
FIG. 4 shows a schematic diagram of a fourth connection of Embodiment 1 of the present disclosure.

FIG. 4 shows a fourth structural schematic diagram of Embodiment 1. The structure comprises a first lead electrode 4001, an electrode 4002, a second lead electrode 4003, an electrode 4004, a first piezoelectric region 4007, a second piezoelectric region 4008, a third piezoelectric region 4009, a fourth piezoelectric region 4010, and an electrode 4006. Particularly, the first piezoelectric region 4007, the second piezoelectric region 4008, the third piezoelectric region 4009, and the fourth piezoelectric region 4010 are all located in the piezoelectric material 4005. Namely, the four piezoelectric regions are located in the same piezoelectric structure. Of the four piezoelectric regions, the upper surfaces are anode surfaces while the lower surfaces are cathode surfaces. The polarization directions of the four piezoelectric regions are all from the anode surfaces to the cathode surfaces. Electrodes are coupled to the anode surfaces and the cathode surfaces of the four piezoelectric regions, respectively. The first lead electrode 4001, the electrode 4002, and the second lead electrode 4003 are positive electrodes; the electrode 4004 and the electrode 4006 are negative electrodes; the electrode 4004 connects the cathode surface of the first piezoelectric region and the cathode surface of the second piezoelectric region; the electrode 4002 connects the anode surface of the second piezoelectric region and the anode surface of the third piezoelectric region; the electrode 4006 connects the cathode surface of the third piezoelectric region and the cathode surface of the fourth piezoelectric region; the first lead electrode 4001 and the second lead electrode 4003 are adapted to electrically connecting the piezoelectric sensing apparatus to the external circuit. Upon use, the first lead electrode 4001 and the second lead electrode 4003 are respectively connected to the lead wire or connected to the external circuit via a conductive track; the electrode 4004 and the electrode 4006 are mechanically connected to the to-be-measured vibrating object.

Embodiment 2

Figure 5:
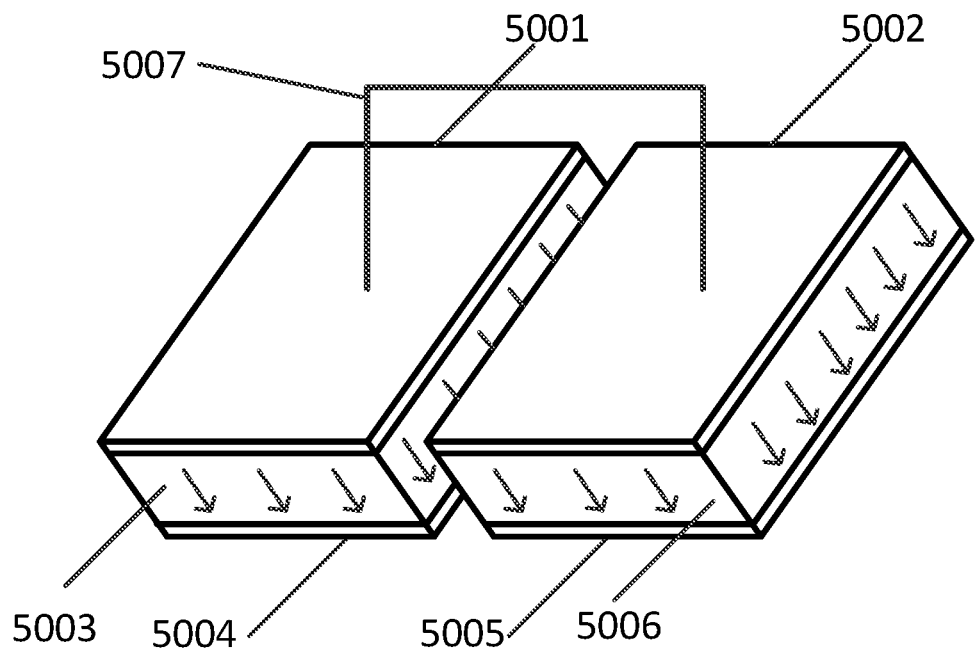
FIG. 5 shows a schematic diagram of a first connection of Embodiment 2 of the present disclosure.

FIGS. 5~8 show four different structures of Embodiment 2. In Embodiment 1, a plurality of electrodes are disposed on the anode surfaces and cathode surfaces in the same piezoelectric region to thereby form a piezoelectric sensing apparatus having a plurality of piezoelectric regions in a same piezoelectric structure; in contrast, in Embodiment 2, electrodes are disposed on anode surfaces and cathode surfaces of different piezoelectric regions to form a piezoelectric sensing apparatus where each piezoelectric region is in a different piezoelectric structure. Particularly, different piezoelectric regions may be connected by an insulative material or connected without using any material; the insulative material must have a certain strength, e.g., plastics, insulative ceramics, acrylic, etc. The insulative material plays a role of intensifying the structural strength, such that the piezoelectric sensing apparatus becomes firmer and more durable during mounting and use. Besides, the intervals between the plurality of piezoelectric regions are adjustable. The intervals between the plurality of piezoelectric regions are not fixed, which may be adjusted based on specific application scenarios, e.g., based on the shape or thickness of the measured object; if a padded insulative material is provided between the plurality of piezoelectric regions, the length of the padded insulative material is not fixed in the piezoelectric region arrangement direction, which may be adjusted based on specific applications, e.g., adjusted based on the shape or thickness of the measured object. Specific illustrations are provided below:

FIG. 5 shows a first structural schematic diagram of Embodiment 2. The structure comprises a first lead electrode 5004, a second lead electrode 5005, a first piezoelectric region 5003, an electrode 5001, an electrode 5002, a second piezoelectric region 5006, and a connecting wire 5007. Particularly, the first piezoelectric region 5003 and the second piezoelectric region 5006 are located in two different piezoelectric materials, i.e., the two piezoelectric regions are disposed in two different piezoelectric structures, respectively. Of the two piezoelectric regions, the upper surfaces are anode surfaces, while the lower surfaces are cathode surfaces, and their polarization directions are both from the anode surfaces to the cathode surfaces. Electrodes are coupled to the anode surfaces and the cathode surfaces of the first piezoelectric region 5003 and the second piezoelectric region 5006, wherein the electrode 5001 and electrode 5002 are positive electrodes, and the first lead electrode 5004 and the second lead electrode 5005 are negative electrodes. The electrode 5001, the first piezoelectric region 5003, and the first lead electrode 5004 form a first piezoelectric structure; the electrode 5002, the second piezoelectric region 5006 and the second lead electrode 5005 form a second piezoelectric structure; besides, the polarization directions of the piezoelectric structures are both from the positive electrodes to the negative electrodes; the connecting wire 5007 connects the two positive electrodes (i.e., electrode 5001 and electrode 5002) of the first piezoelectric structure and the second piezoelectric structure; and the first lead electrode 5004 and the second lead electrode 5005 are adapted to electrically connecting the piezoelectric sensing apparatus to the external circuit. Upon use, the first lead electrode 5004 and the second lead electrode 5005 are respectively connected to the lead wire or connected to the external circuit via a conductive track; the electrode 5001 and the electrode 5002 are mechanically connected to the to-be-measured vibrating object.

Figure 6A:
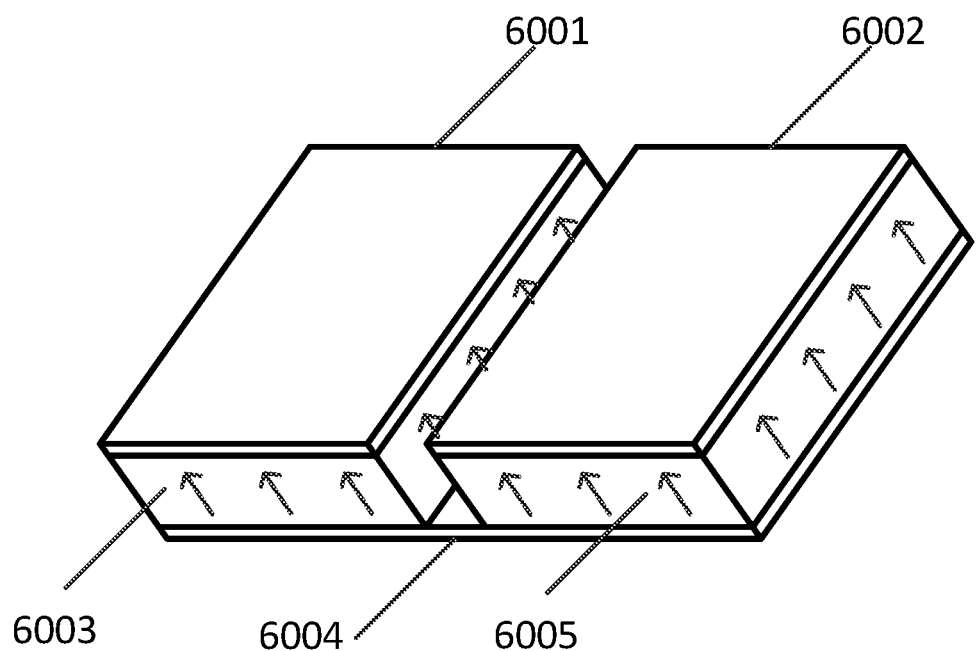
FIG. 6(a) shows a first schematic diagram of the second connection of Embodiment 2 of the present disclosure.
Figure 6B:
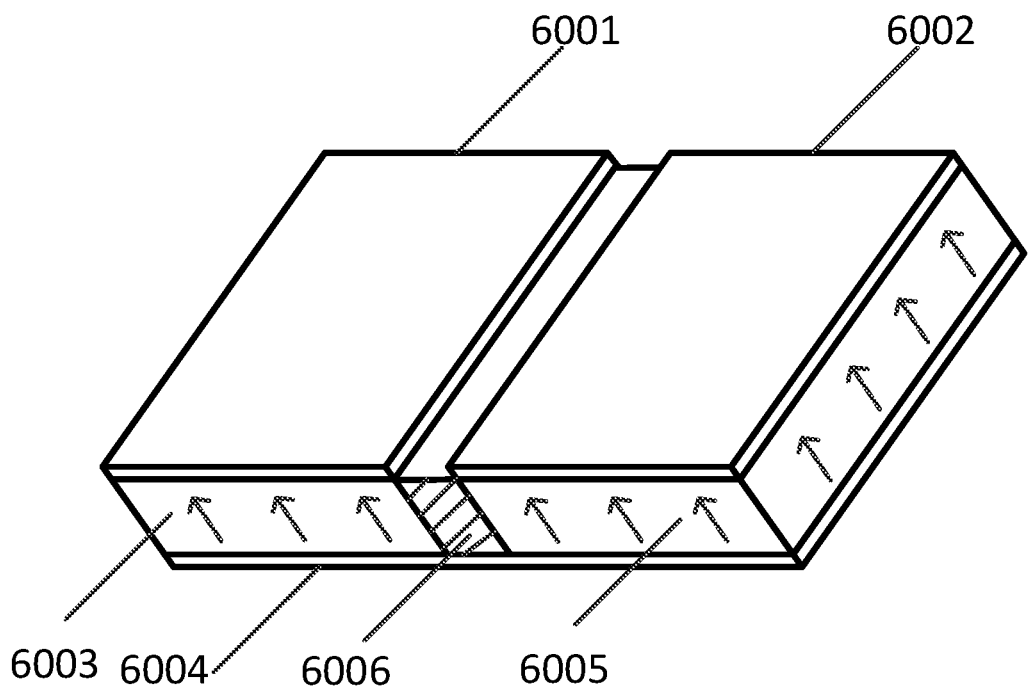
FIG. 6(b) shows a second schematic diagram of the second connection of Embodiment 2 of the present disclosure.

FIG. 6 shows a second structural schematic diagram of Embodiment 2. FIG. 6 includes two structures: (a) and (b). FIG. 6(a) shows a structure comprising a first lead electrode 6001, a second lead electrode 6002, a first piezoelectric region 6003, an electrode 6004, and a second piezoelectric region 6005. Particularly, the first piezoelectric region 6003 and the second piezoelectric region 6005 are respectively located in two different piezoelectric materials, i.e., the two piezoelectric regions are disposed in two different piezoelectric structures, respectively. Of the two piezoelectric regions, the lower surfaces are anode surfaces, while the upper surfaces are cathode surfaces, and their polarization directions are both from the anode surfaces to the cathode surfaces. Electrodes are coupled to the anode surfaces and the cathode surfaces of the first piezoelectric region 6003 and the second piezoelectric region 6005, respectively, wherein the electrode 6004 is a positive electrode, and the first lead electrode 6001 and the second lead electrode 6002 are negative electrodes. The electrode 6004, the first piezoelectric region 6003, and the first lead electrode 6001 form a first piezoelectric structure; the electrode 6004, the second piezoelectric region 6005 and the second lead electrode 6002 form a second piezoelectric structure; besides, the polarization directions of the two piezoelectric structures are both from the positive electrodes to the negative electrodes; the electrode 6004 connects the positive electrode of the first piezoelectric structure and the negative electrode of the second piezoelectric structure; and the first lead electrode 6001 and the second lead electrode 6002 are adapted to electrically connecting the piezoelectric sensing apparatus to the external circuit. Upon use, the first lead electrode 6001 and the second lead electrode 6002 are respectively connected to the lead wire or connected to the external circuit via a conductive track; the electrode 6004 is adhered to the to-be-measured vibrating object. Compared with the structure of FIG. 6(a), the structure of FIG. 6(b) further comprises an insulative connecting sheet 6006. The insulative connecting sheet plays a role of intensifying the structural strength, such that the piezoelectric sensing apparatus becomes firmer and more durable during mounting and use.

Figure 7:
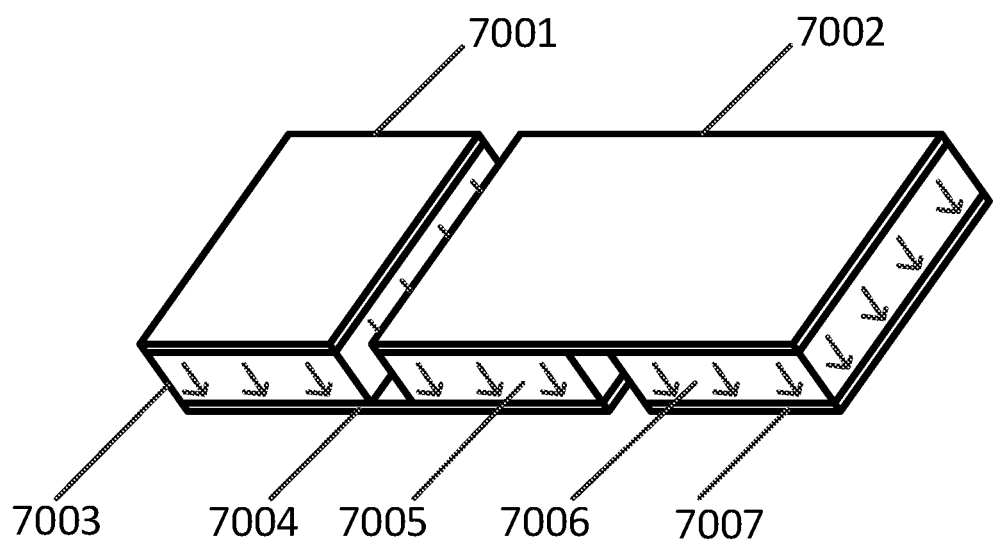
FIG. 7 shows a schematic diagram of a third connection of Embodiment 2 of the present disclosure.

FIG. 7 shows a third structural schematic diagram of Embodiment 2. The structure comprises a first lead electrode 7001, an electrode 7002, a second lead electrode 7007, a first piezoelectric region 7003, an electrode 7004, a second piezoelectric region 7005, and a third piezoelectric region 7006. Particularly, the first piezoelectric region 7003, the second piezoelectric region 7005, and the third piezoelectric region 7007 are respectively located in three different piezoelectric materials, i.e., the three piezoelectric regions are disposed in three different piezoelectric structures, respectively. Of the three piezoelectric regions, the upper surfaces are anode surfaces, while the lower surfaces are cathode surfaces, and their polarization directions are all from the anode surfaces to the cathode surfaces. Electrodes are coupled to the anode surfaces and the cathode surfaces of the first piezoelectric region 7003, the second piezoelectric region 7005, and the third piezoelectric region 7007, respectively; the first lead electrode 7001 and the electrode 7002 are positive electrodes; the electrode 7004 and the electrode 7007 are negative electrodes; the polarization directions of the first piezoelectric zone 7003, the second piezoelectric region 7005 and the third piezoelectric region 7006 are all from the positive electrodes to the negative electrodes; the first lead electrode 7001, the first piezoelectric region 7003 and the electrode 7004 form a first piezoelectric structure; the electrode 7002, the second piezoelectric region 7005, and the electrode 7004 form a second piezoelectric structure; the electrode 7002, the third piezoelectric region 7006, and the second lead electrode 7007 form a third piezoelectric structure; besides, the polarization directions of the three piezoelectric structures are all from positive electrodes to the negative electrodes; the electrode 7004 connects the negative electrode of the first piezoelectric structure and the negative electrode of the second piezoelectric structure; the electrode 7002 connects the positive electrode of the second piezoelectric structure and the positive electrode of the third piezoelectric structure; and the first lead electrode 7001 and the second lead electrode 7007 are adapted to electrically connecting the piezoelectric sensing apparatus to the external circuit. Upon use, the first lead electrode 7001 and the second lead electrode 7007 are respectively connected to the lead wire or connected to the external circuit via a conductive track, respectively. However, in this structure, as the first lead electrode 7001 and the second lead electrode 7007 are not located in the same plane, upon use, the electrode 7002 and the electrode 7004 cannot be mechanically connected to the to-be-measured vibrating object, which causes inconvenience in use. Therefore, by improving this structure, the fourth structure of Embodiment 2 is obtained.

Figure 8:
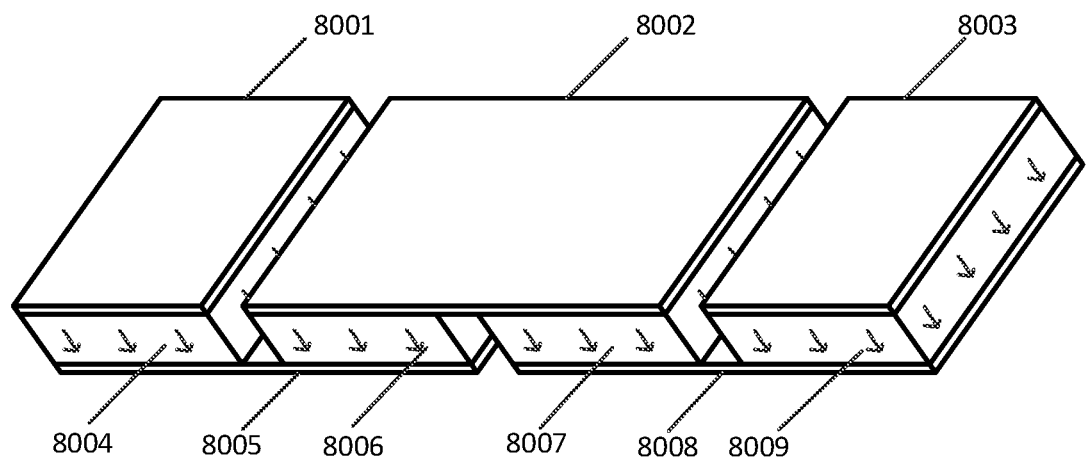
FIG. 8 shows a schematic diagram of a fourth connection of Embodiment 2 of the present disclosure.

FIG. 8 shows a fourth structural schematic diagram of Embodiment 2. The structure comprises a first lead electrode 8001, an electrode 8002, a second lead electrode 8003, a first piezoelectric region 8004, an electrode 8005, a second piezoelectric region 8006, a third piezoelectric region 8007, an electrode 8008, and a fourth piezoelectric region 8009. Particularly, the first piezoelectric region 8004, the second piezoelectric region 8006, the third piezoelectric region 8007, and the fourth piezoelectric region 8009 are respectively located in four different piezoelectric materials, i.e., the four piezoelectric regions are disposed in four different piezoelectric structures, respectively. Of the four piezoelectric regions, the upper surfaces are anode surfaces, while the lower surfaces are cathode surfaces, and their polarization directions are all from the anode surfaces to the cathode surfaces. Electrodes are coupled to the anode surfaces and the cathode surfaces of the first piezoelectric region 8004, the second piezoelectric region 8006, the third piezoelectric region 8007, and the fourth piezoelectric region 8009, respectively; the first lead electrode 8001, the electrode 8002, and the second lead electrode 8003 are positive electrodes; the electrode 8005 and the electrode 8008 are negative electrodes; the polarization directions of the first piezoelectric region 8004, the second piezoelectric region 8006, the third piezoelectric region 8007, and the fourth piezoelectric region 8009 are all from the positive electrodes to the negative electrodes; the first lead electrode 8001, the first piezoelectric region 8004 and the electrode 8005 form a first piezoelectric structure; the electrode 8002, the second piezoelectric region 8006, and the electrode 8005 form a second piezoelectric structure; the electrode 8002, the third piezoelectric region 8007, and the electrode 8008 form a third piezoelectric structure; the second lead electrode 8003, the fourth piezoelectric region 8009, and the electrode 8008 form a fourth piezoelectric structure; besides, the polarization directions of the four piezoelectric structures are all from positive electrodes to the negative electrodes; the electrode 8005 connects the negative electrode of the first piezoelectric structure and the negative electrode of the second piezoelectric structure; the electrode 8002 connects the positive electrode of the second piezoelectric structure and the positive electrode of the third piezoelectric structure; the electrode 8008 connects the third piezoelectric structure and the fourth piezoelectric structure; and the first lead electrode 8001 and the second lead electrode 8003 are adapted to electrically connecting the piezoelectric sensing apparatus to the external circuit. Upon use, the first lead electrode 8001 and the second lead electrode 8003 are respectively connected to the lead wire or connected to the external circuit via conductive tracks; moreover, the two lead electrodes are disposed on a same horizontal plane; therefore, upon use, the electrode 8005 and the electrode 8008 may be mechanically connected to the to-be-measured vibrating object.

Figure 9:
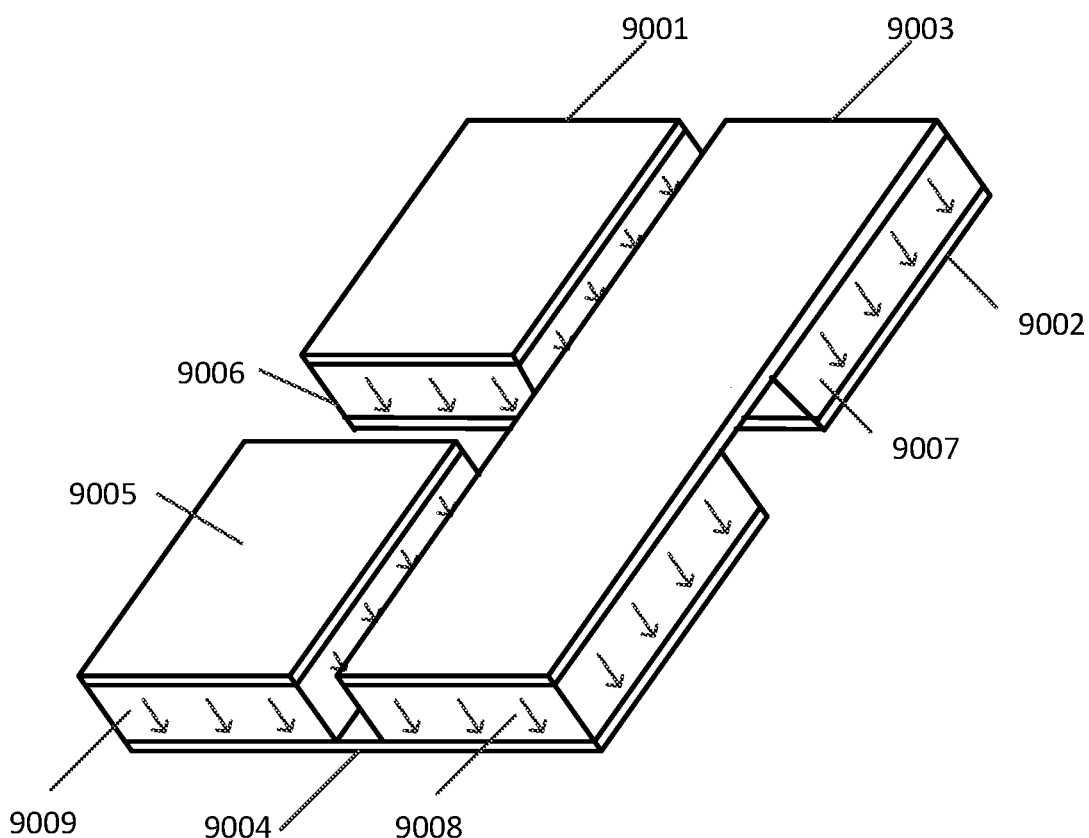
FIG. 9 shows a schematic diagram of a fifth connection of Embodiment 2 of the present disclosure.

FIG. 9 shows a fifth structural schematic diagram of Embodiment 2. The structure comprises a first lead electrode 9001, an electrode 9002, an electrode 9003, an electrode 9004, a second lead electrode 9005, a first piezoelectric region 9006, a second piezoelectric region 9007, a third piezoelectric region 9008, and a fourth piezoelectric region 9009. Particularly, the first piezoelectric region 9006, the second piezoelectric region 9007, the third piezoelectric region 9008, and the fourth piezoelectric region 9009 are respectively located in four different piezoelectric materials, i.e., the four piezoelectric regions are disposed in four different piezoelectric structures, respectively. Of the four piezoelectric regions, the upper surfaces are anode surfaces, while the lower surfaces are cathode surfaces, and their polarization directions are all from the anode surfaces to the cathode surfaces. Electrodes are coupled to the anode surfaces and the cathode surfaces of the first piezoelectric region 9006, the second piezoelectric region 9007, the third piezoelectric region 9008, and the fourth piezoelectric region 9009, respectively; the first lead electrode 9001, the electrode 9003, and the second lead electrode 9005 are positive electrodes; the electrode 9002 and the electrode 9004 are negative electrodes; the polarization directions of the first piezoelectric region 9006, the second piezoelectric region 9007, the third piezoelectric region 9008, and the fourth piezoelectric region 9009 are from the positive electrodes to the negative electrodes; the first lead electrode 9001, the first piezoelectric region 9006 and the electrode 9002 form a first piezoelectric structure; the electrode 9002, the second piezoelectric region 9007, and the electrode 9003 form a second piezoelectric structure; the electrode 9003, the third piezoelectric region 9008, and the electrode 9004 form a third piezoelectric structure; the second lead electrode 9005, the fourth piezoelectric region 9009, and the electrode 9004 form a fourth piezoelectric structure; moreover, the polarization directions of the four piezoelectric structures are all from positive electrodes to the negative electrodes; the electrode 9002 connects the negative electrode of the first piezoelectric structure and the negative electrode of the second piezoelectric structure; the electrode 9003 connects the positive electrode of the second piezoelectric structure and the positive electrode of the third piezoelectric structure; the electrode 9004 connects the third piezoelectric structure and the fourth piezoelectric structure; and the first lead electrode 9001 and the second lead electrode 9005 are adapted to electrically connecting the piezoelectric sensing apparatus to the external circuit. Upon use, the first lead electrode 9001 and the second lead electrode 9005 are connected to the lead wire or connected to the external circuit via a conductive track, respectively; the electrode 9002 and the electrode 9004 are mechanically connected to a to-be-measured vibrating object.

Figure 10:
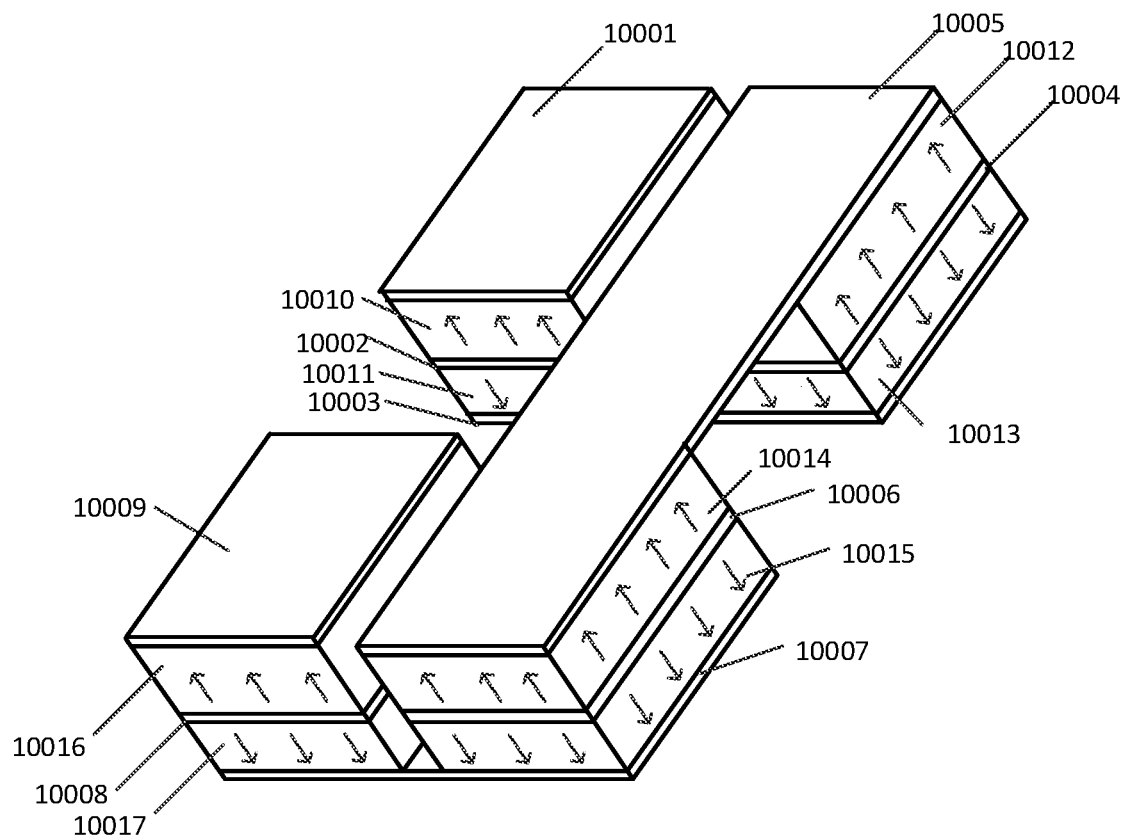
FIG. 10 shows a schematic diagram of a sixth connection of Embodiment 2 of the present disclosure.

FIG. 10 shows a sixth structural schematic diagram of Embodiment 2. The structure comprises a first lead electrode 10001, an electrode 10002, an electrode 10003, an electrode 10004, an electrode 10005, an electrode 10006, an electrode 10007, an electrode 10008, a second lead electrode 10009, a first piezoelectric region 10010, a second piezoelectric region 10011, a third piezoelectric region 10012, a fourth piezoelectric region 10013, a fifth piezoelectric region 10014, a sixth piezoelectric region 10015, a seventh piezoelectric region 10016, and an eighth piezoelectric region 10017. Particularly, the first piezoelectric region 10010, the second piezoelectric region 10011, the third piezoelectric region 10012, the fourth piezoelectric region 10013, the fifth piezoelectric region 10014, the sixth piezoelectric region 10015, the seventh piezoelectric region 10016, and the eighth piezoelectric region 10017 are respectively located in eight different piezoelectric materials, i.e., the eight piezoelectric regions are disposed in eight different piezoelectric structures, respectively. Of the eight piezoelectric regions, the upper surfaces are anode surfaces, while the lower surfaces are cathode surfaces, and their polarization directions are all from the anode surfaces to the cathode surfaces. Electrodes are coupled to the anode surfaces and the cathode surfaces of the first piezoelectric region 10010, the second piezoelectric region 10011 the third piezoelectric region 10012, the fourth piezoelectric region 10013, the fifth piezoelectric region 10014, the sixth piezoelectric region 10015, the seventh piezoelectric region 10016, and the eighth piezoelectric region 10017, respectively, wherein the electrode 10002, the electrode 10004, the electrode 10006, and the electrode 10008 are positive electrodes, while the electrode 10001, the electrode 10003, the electrode 10005, the electrode 10007, and the electrode 10009 are negative electrodes. The first lead electrode 10001, the first piezoelectric region 10010, and the electrode 10002 form a first piezoelectric structure; the electrode 10002, the second piezoelectric region 10011, and the electrode 10003 form a second piezoelectric structure; the electrode 10005, the third piezoelectric region 10012, and the electrode 10004 form a third piezoelectric structure; the electrode 10004, the fourth piezoelectric region 10013, and the electrode 10003 form a fourth piezoelectric structure; the electrode 10005, the fifth piezoelectric region 10014, and the electrode 10006 form a fifth piezoelectric structure; the electrode 10006, the sixth piezoelectric region 10015, and the electrode 10007 form a sixth piezoelectric structure; the second lead electrode 10009, the seventh piezoelectric region 10016, and the electrode 10008 form a seventh piezoelectric structure; and the electrode 10008, the eighth piezoelectric region 10017, and the electrode 10007 form an eighth piezoelectric structure. Moreover, the polarization directions of the eight piezoelectric structures are all from positive electrodes to negative electrodes. The electrode 10002 connects the positive electrode of the first piezoelectric structure and the positive electrode of the second piezoelectric structure; the electrode 10004 connects the positive electrode of the third piezoelectric structure and the positive electrode of the fourth piezoelectric structure; the electrode 10003 connects the negative electrode of the second piezoelectric structure and the negative electrode of the fourth piezoelectric structure; the electrode 10005 connects the negative electrode of the third piezoelectric structure and the negative electrode of the fifth piezoelectric structure; the electrode 10006 connects the positive electrode of the fifth piezoelectric structure and the positive electrode of the sixth piezoelectric structure; the electrode 10007 connects the negative electrode of the fifth piezoelectric structure and the negative electrode of the eighth piezoelectric structure; and the electrode 10008 connects the positive electrode of the seventh piezoelectric structure and the positive electrode of the eighth piezoelectric structure; the first lead electrode 10001 and the second lead electrode 10009 are adapted to electrically connecting the piezoelectric sensing apparatus to the external circuit. Upon use, the first lead electrode 10001 and the second lead electrode 10009 are respectively connected to the lead wire or connected to the external circuit via a conductive track; the electrode 10003 and the electrode 10007 are mechanically connected to the to-be-measured vibrating object. In this structure, the piezoelectric structure adopts a layered connection manner to form an arrangement in a three-dimensional array. This embodiment only provides one structure of arrangement in the three-dimensional array, i.e., 2×2×2× three-dimensional matrix arrangement; besides the three-dimensional matrix arrangement shown in this embodiment, a plurality of other three-dimensional matrix arrangement manners may be adopted, such as 2×2× 3, 3×3×3, 3×3×4, and 5×5×5.

Embodiment 3

Figure 11:
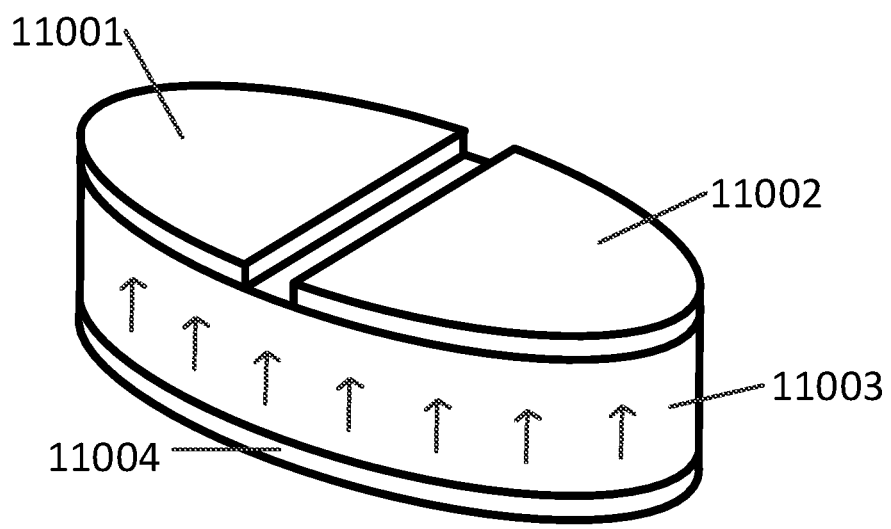
FIG. 11 shows a structural schematic diagram of Embodiment 3 of the present disclosure.

FIG. 11 shows a structural schematic diagram of Embodiment 3. Different from the foregoing embodiments, this embodiment adopts a circular piezoelectric body, comprising: a first lead electrode 11001, a second lead electrode 11002, a piezoelectric body 11003, and a connecting electrode 11005. In the figure, the first lead electrode 11001 and the second lead electrode 11002 are coupled to a cathode end of the corresponding piezoelectric body, and the connecting electrode 11004 is coupled to an anode end of the piezoelectric body. In this embodiment, the circular piezoelectric body 11003 as adopted is applicable for a specific mounting scenario, which more facilitates mounting than a square piezoelectric body.

Embodiment 4

Figure 13:
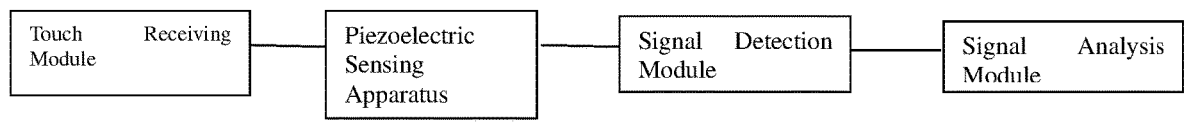
FIG. 13 shows a structural schematic diagram of Embodiment 4 of the present disclosure.

FIG. 13 shows a structural schematic diagram of a touch detecting apparatus, comprising: a touch receiving module, a piezoelectric sensing apparatus, a signal detection module, and a signal analysis module. Particularly, the touch receiving module is configured for receiving a touch action; the piezoelectric sensing apparatus is configured for converting the touch action received by the touch receiving module into a piezoelectric signal; the signal detection module is configured for detecting a piezoelectric signal outputted by the piezoelectric sensing apparatus; and the signal processing module is configured to analyzing the detected piezoelectric signal to obtain touch position information. In this embodiment, the touch receiving module is an LED screen; and there are at least two piezoelectric sensing apparatuses. In the case of two piezoelectric sensing apparatuses, they are distributed at two endpoint positions of a diagonal line of the touch receiving module; in the case of three piezoelectric sensing apparatuses, they are respectively distributed at three corner positions of the four corner positions of the touch receiving module or respectively distributed at boundary positions of the touch receiving apparatus; in the case of four piezoelectric sensing apparatuses, they are respectively distributed at four corner positions of the touch receiving module or respectively distributed at boundary positions of the touch receiving module; in the case of more than four piezoelectric sensing apparatuses, four of them are distributed at the four corner positions of the touch receiving module, while the remaining piezoelectric sensing apparatuses are distributed at boundary positions. A plurality of piezoelectric sensing apparatuses, i.e., the piezoelectric sensing apparatuses described in Embodiment 1 or Embodiment 2, may be arranged in a two-dimensional matrix manner, e.g., arranged into a 3×3, 5×5, or 7×7 matrix, respectively distributed at the boundary, corner ends, and central position of the touch receiving module; if the piezoelectric sensing apparatus is in a 3×3 matrix distribution, four of the nine piezoelectric sensing apparatuses are distributed at corner ends, four are distributed at middle positions of the four edges of the touch receiving module, while one is distributed at the central point of the touch receiving module.

Embodiment 5

Figure 14:
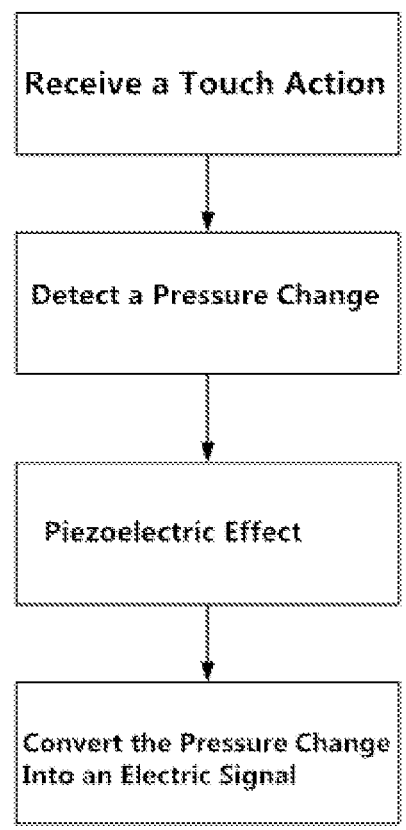
FIG. 14 shows a flow diagram of a first method of Embodiment 5 of the present disclosure.

As shown in FIG. 14, a method for touch detection is further provided, specifically comprising steps of:

receiving, by a touch receiving module, a touch action, wherein the touch receiving module may refer to any module appropriate for detecting a vibration, e.g., a glass plate, a plastic plate, a metal plate, etc., or may be a display screen, such as a projection display screen, a liquid crystal display screen, an LED display screen, an LCD display screen, or a CRT display screen, etc.; in this embodiment, the touch receiving module is an LED display screen; the touch action includes a touch to the touch receiving module, which may produce a pressure, including a click touch, a slide touch, etc.;

detecting, by the piezoelectric sensing apparatus, a pressure change produced by the touch action; wherein the pressure sensing apparatus refers to the piezoelectric sensing apparatus in Embodiment 1 or Embodiment 2; four pressure sensing apparatuses are provided, which are distributed at four corners of the LED display screen; when the user clicks onto the touch receiving apparatus (i.e., the LED display screen), the four piezoelectric sensing apparatuses detect pressure changes on the touch receiving apparatuses, respectively; and converting, by the piezoelectric sensing apparatus, the detected pressure change into an electrical due to the piezoelectric effect. Thanks to the piezoelectric effect, the piezoelectric sensing apparatus converts the pressure change to the charge change and then to an electrical signal; the electrical signal is outputted via two lead electrodes.

Figure 15:
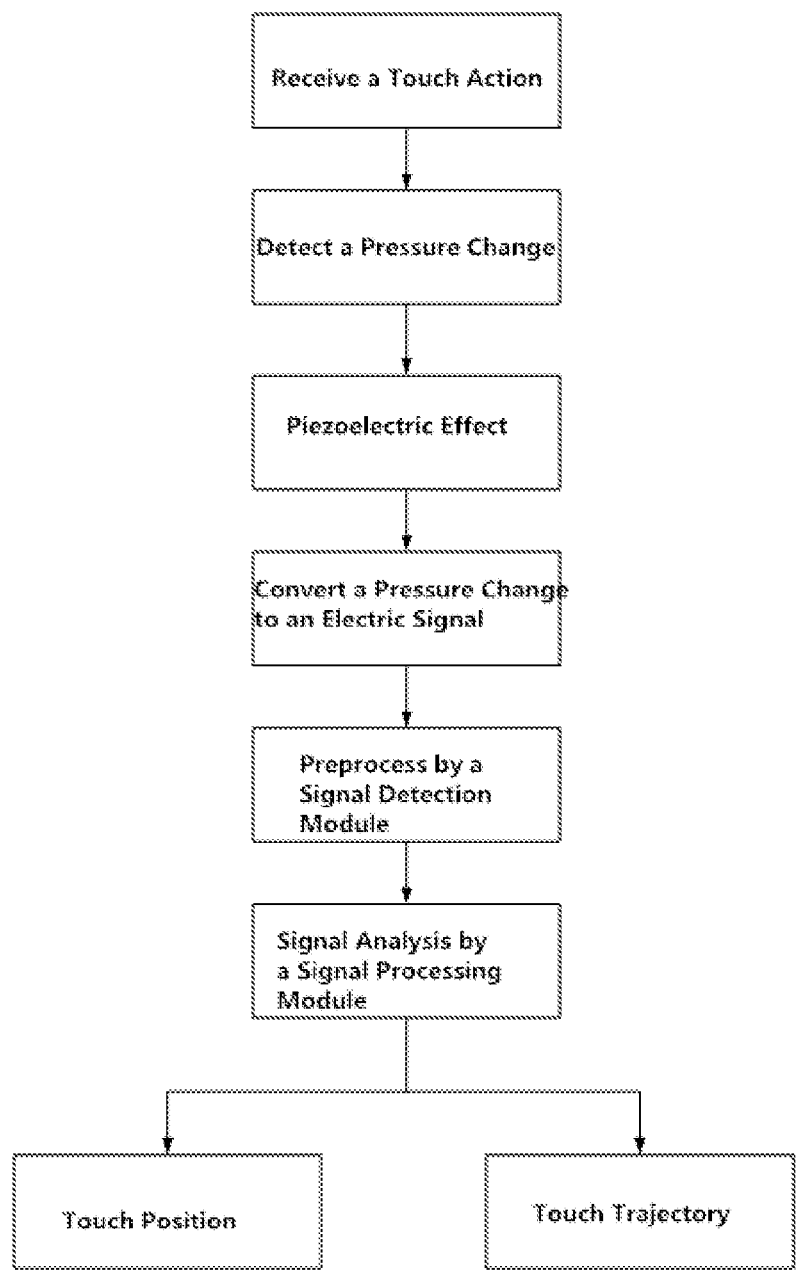
FIG. 15 shows a flow diagram of a second method of Embodiment 5 of the present disclosure.

As shown in FIG. 15, the touch detection method is further improved to obtain a second touch detection method, further comprising:

receiving, by a signal detection module, a piezoelectric signal, and preprocessing the piezoelectric signal; wherein the preprocessing includes necessary processing conducted for guaranteeing the accuracy and reliability of signal detection, e.g., denoising processing or signal amplification.

analyzing, by a signal processing module, the detected piezoelectric signal to obtain a touch position and/or a touch trajectory of the touch action. That is, the four piezoelectric sensing apparatuses process the detected electrical signals, respectively, to obtain the touch position; if the touch is a continuous touch, for example, a sliding touch, change of the touch position may be compared and analyzed to obtain the touch trajectory.

In this embodiment, A plurality of piezoelectric sensing apparatuses, i.e., the piezoelectric sensing apparatuses described in Embodiment 1 or Embodiment 2, may be arranged in a two-dimensional matrix manner, e.g., arranged into a 3×3, 5×5, or 7×7 matrix, respectively distributed at the boundary, corner ends, and central position of the touch receiving module; if the piezoelectric sensing apparatus is in a 3×3 matrix distribution, four of the nine piezoelectric sensing apparatuses are distributed at corner ends, four are distributed at middle positions of the four edges of the touch receiving module, while one is distributed at the central point of the touch receiving module. By analyzing the electric signals detected by the piezoelectric sensing apparatuses arranged in a matrix to obtain the touch position, if the touch is a continuous touch (e.g., a sliding touch), changes of the touch position may be compared and analyzed to obtain a touch trajectory; by increasing the number of piezoelectric sensing apparatuses, the detection accuracy is improved.

It should be noted that the above illustrations of the present disclosure through the preferred embodiments are only schematic, not limitative. Those of normal skill in the art may modify the technical solutions of the various embodiments based on the embodiments above or equivalently substitute part of the technical features thereof; while such modifications or substitutions should all fall within the protection scope of the present disclosure. Therefore, the protection scope of the present disclosure should be limited by the appended claims.

What is claimed is:

1. A piezoelectric sensing apparatus, comprising: a plurality of piezoelectric regions, each piezoelectric region including a piezoelectric body, an anode surface and a cathode surface, wherein the plurality of piezoelectric regions are successively connected via at least one electrode from a first piezoelectric region to a last piezoelectric region such that between adjacent piezoelectric regions, surfaces of a same polarity are connected, i.e., one anode surface is connected to another anode surface, while one cathode surface is connected to another cathode surface; and the piezoelectric body refers to a material body with piezoelectric effect;

a first lead electrode and a second lead electrode, which are coupled to a non-connection end of the first piezoelectric region with its adjacent piezoelectric region and a non-connection end of the last piezoelectric region with its adjacent piezoelectric region, respectively; and the at least one electrode is mechanically connected to a to-be-measured vibrating object, a potential difference produced between the first lead electrode and the second lead electrode thanks to the piezoelectric effect, wherein under the action of the potential difference, an electrical signal is produced;

wherein by adjusting the magnitude of the equivalent distance between the two adjacent piezoelectric regions, the demarcation point between a high frequency signal and a low frequency signal of the electrical signal be adjusted and the amplification multiple of the high frequency signal of the electrical signal be adjusted, a demarcation point between the high frequency and the low frequency herein is defined as:

$$f=v/(6*d)$$

where v denotes the speed of mechanical wave propagation in a to-be-measured object, and d denotes an equivalent distance between the two piezoelectric regions, a signal with a frequency above the $f=v/(6*d)$ in the equation is referred to as a high-frequency signal, while a signal below the $f=v/(6*d)$ is referred to as a low-frequency signal.

2. The piezoelectric sensing apparatus according to claim 1, further comprising:

a connecting electrode, the connecting electrode being rigid or flexible.

3. The piezoelectric sensing apparatus according to claim 1, wherein the plurality of piezoelectric regions use different parts of a same piezoelectric body.

4. The piezoelectric sensing apparatus according to claim 1, wherein the plurality of piezoelectric regions use different and separate piezoelectric bodies.

5. The piezoelectric sensing apparatus according to claim 1, wherein the plurality of piezoelectric regions are arranged abreast or in a straight-line link;

or, the plurality of piezoelectric regions are arranged in a two-dimensional array form;

or, the plurality of piezoelectric regions are arranged in layers or in a three-dimensional array form.

6. The piezoelectric sensing apparatus according to claim 1, wherein a padded insulative material is provided between piezoelectric bodies of the plurality of piezoelectric regions.

7. The piezoelectric sensing apparatus according to claim 1, wherein an interval between piezoelectric bodies of the plurality of piezoelectric regions is adjustable.

8. The piezoelectric sensing apparatus according to claim 1, wherein a shape of the piezoelectric bodies of the plurality of piezoelectric regions is to a square shape, or a circular shape.

9. A touch receiving apparatus, comprising the piezoelectric apparatus according to claim 1.

* * * * *